(12) United States Patent
Singlevich et al.

(10) Patent No.: US 10,283,421 B2
(45) Date of Patent: May 7, 2019

(54) SYSTEM TO DETECT WAFER ARCING IN SEMICONDUCTOR MANUFACTURING EQUIPMENT

(71) Applicant: APPLIED MATERIALS, INC., Santa Clara, CA (US)

(72) Inventors: Scott Singlevich, Colorado Springs, CO (US); Kommisetti Subrahmanyam, Singapore (SG); Tony Davis, Austin, TX (US); Michael Johnson, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 367 days.

(21) Appl. No.: 15/362,706

(22) Filed: Nov. 28, 2016

(65) Prior Publication Data

US 2017/0077002 A1    Mar. 16, 2017

Related U.S. Application Data

(62) Division of application No. 13/687,754, filed on Nov. 28, 2012, now Pat. No. 9,508,612.

(Continued)

(51) Int. Cl.
*G01R 31/02* (2006.01)
*G01R 31/08* (2006.01)
(Continued)

(52) U.S. Cl.
CPC ............ *H01L 22/20* (2013.01); *G01R 31/024* (2013.01); *G01R 31/08* (2013.01); *G06F 17/00* (2013.01);
(Continued)

(58) Field of Classification Search
CPC ... H01L 22/20; H01L 21/67253; H01L 22/14; H01L 2924/0002; G01R 31/024;
(Continued)

(56) References Cited

U.S. PATENT DOCUMENTS 5,855,681 A    1/1999    Maydan et al.
5,862,054 A    1/1999    Li
(Continued)

FOREIGN PATENT DOCUMENTS

TW    201342513 A    10/2013
TW    I627695 B    6/2018
(Continued)

OTHER PUBLICATIONS

TW105142983, "Notice of Decision to Grant", dated Apr. 3, 2018, 4 pages.

(Continued)

*Primary Examiner* — Regis J Betsch
(74) *Attorney, Agent, or Firm* — Kilpatrick Townsend & Stockton LLP

(57) ABSTRACT

Methods and systems for accurate arc detection in semiconductor manufacturing tools are disclosed. Such methods and systems provide real-time arc detection and near real-time notification for corrective actions during a semiconductor manufacturing process. Such methods and systems utilize data with high sample rate and wavelet analysis to provide for more accurate arc detection, which leads to more effective and cost efficient semiconductor manufacturing operations.

8 Claims, 12 Drawing Sheets

Related U.S. Application Data

(60) Provisional application No. 61/611,441, filed on Mar. 15, 2012.

(51) Int. Cl.
  *G06F 17/00* (2019.01)
  *H01J 37/32* (2006.01)
  *H01L 21/66* (2006.01)
  *H01L 21/67* (2006.01)

(52) U.S. Cl.
  CPC .. *H01J 37/32917* (2013.01); *H01J 37/32935* (2013.01); *H01J 37/32944* (2013.01); *H01L 21/67253* (2013.01); *H01L 22/14* (2013.01); *H01J 37/32183* (2013.01); *H01J 37/32541* (2013.01); *H01J 2237/3321* (2013.01); *H01L 2924/0002* (2013.01)

(58) Field of Classification Search
  CPC .... G01R 31/08; G06F 17/00; H01J 37/32917; H01J 37/32935; H01J 37/32944; H01J 37/32183; H01J 2237/3321
  See application file for complete search history.

(56) References Cited

U.S. PATENT DOCUMENTS

| | | |
|---|---|---|
| 7,725,208 B2 | 5/2010 | Shanmugasundram et al. |
| 2004/0035529 A1 | 2/2004 | Grimbergen |
| 2008/0197854 A1 | 8/2008 | Valcore et al. |
| 2010/0020451 A1 | 1/2010 | Changali et al. |
| 2013/0245969 A1 | 9/2013 | Singlevich et al. |

FOREIGN PATENT DOCUMENTS

| | | |
|---|---|---|
| WO | 2008100296 A1 | 8/2008 |
| WO | 2011022294 A1 | 2/2011 |
| WO | 2013138059 | 9/2013 |

OTHER PUBLICATIONS

TW105142983, "Office Action", dated Sep. 4, 2017, 3 pages.
U.S. Appl. No. 13/687,754, "Non-Final Office Action", dated Feb. 3, 2016, 17 pages.
U.S. Appl. No. 13/687,754, "Notice of Allowance", dated Jun. 21, 2016, 13 pages.
Leavey, et al., "An introduction to wavelet transforms: a tutorial approach", J Summerscales and R Sutton, Insight—Non-Destructive Testing and Condition Monitoring, Insight—Non-Destructive Testing and Condition Monitoring, vol. 45, No. 5, May 1, 2003, pp. 344-353.
Michalik, "Wavelet Tranwsform Approach to High Impedance Fault Detection in MV Networks", Power Tech, 2005 IEEE Russia, Jun. 2005, pp. 1-7.
PCT/US2013/027659, "International Search Report & Written Opinion", dated Jul. 9, 2013, 13 pages.
TW102107880, "Notice of Allowance", dated Nov. 21, 2016, 4 pages.
TW102107880, "Office Action", dated Aug. 22, 2016, 7 pages.
Valens, "A Really Friendly Guide to Wavelets", Available online at http://agl.cs.unm.edu/~williams/cs530/arfgtw.pdf, 1999, 19 pages.

*5Hz data*

*1000Hz data overlay on 5Hz data*

SYSTEM TO DETECT WAFER ARCING IN SEMICONDUCTOR MANUFACTURING EQUIPMENT

CROSS-REFERENCE SECTION

This application is a division of U.S. application Ser. No. 13/687,754, filed Nov. 28, 2012, which claims priority to Provisional U.S. Patent Application No. 61/611,441, filed Mar. 15, 2012. The entire disclosures of each are hereby incorporated by reference, for all purposes, as if fully set forth herein.

BACKGROUND OF THE INVENTION

This invention is generally related to thin films processing using semiconductor manufacturing equipment and is particularly directed to detection of arcing phenomena that may happen while using semiconductor manufacturing tools, for example a Physical Vapor Deposition (PVD) tool.

Arcing problems may exist in almost all plasma environments within semiconductor process equipment due to a high voltage difference between two closely spaced points in a processing chamber of the semiconductor manufacturing equipment during manufacturing operations. For example, a direct current (DC) bipolar arcing may occur if there is excessive deposition or contamination on the deposition and/or cover ring of a PVD tool. As the result, such DC bipolar arcs may cause ablation of underlying materials, wafer breakage, and/or damage to the processing chamber. In order to minimize these undesirable incidents, arc detection systems have been developed. These systems, however, generally do not detect subtle arcing events or provide many false arc detections.

Failure to detect arcing events during the thin film processing leads to batches of unusable or low yield semiconductor wafers which, in turn, may lead to loss of potentially thousands of dollars in revenue. In addition, false arc detections may halt the processing and production, waste resources for inspection of the manufacturing tools, and cause mechanical defects in the manufacturing tools due to excessive inspections.

BRIEF SUMMARY OF THE INVENTION

The following presents a simplified summary of some embodiments in order to provide a basic understanding. This is not intended to identify key/critical elements or to delineate the scope of the embodiments. Its sole purpose is to present some aspects and embodiments in a simplified form as a prelude to the more detailed description that is presented later.

Embodiments of the invention can be used to identify arc events. In particular embodiments of the invention can be used to solve a number of arc detection-related problems, which can result in a more efficient and cost effective manufacturing process. One problem in arc detection is that arcing can last for only a brief moment (on the order of about 15 milliseconds), which can be unreported due to the short duration of the event. Embodiments of the invention seek to solve this problem by sampling processing parameters at high capture rates. Another problem with arc detection is false positive arc detection, which can disrupt processing and can lead to a product being scrapped that should not be scrapped. Embodiments of the invention seek to solve this problem by using unique mathematical techniques to improve the signal and/or reduce noise. Another problem that can occur in arc detection is related to the recipe or process-dependent characteristics of an arc. That is, different processes and/or recipes may have different indicia of arcing. Embodiments of the invention dynamically change the parameters that indicate an arc in conjunction with a change in the process or recipe.

This summary, the drawings, and the detailed description include further description of the embodiments the invention.

In some embodiments, detection of arcing events occur with high arc capture rates and minimize false positive arcing detections. Specific high capture rate Data Acquisition and Collection (DAC) systems capable of collecting data for multiple process parameters with adjustable sample rates may be interfaced with a processor and/or a sophisticated fault detection and classification systems for data analysis and notification in case of arc event detection. For example, a 1000 Hz sampling rate may be used for detecting arcing events with a duration of about 15 milliseconds without major loss of magnitude. In other embodiments, the sampling rate may be increased to approximately about 250 kHz for detecting micro arcs with very short durations.

The analysis of arc detections may include synchronization of data received from the integrated DAC systems with specific processed wafers and recipe components and/or subcomponents associated with data received from the DAC systems. This way, each individual wafer and process recipe component may be analyzed for detection of arcing event using captured data from the DAC systems in order to allow for more rigorous product quality control.

The analysis of arc detections may further include a wavelet analysis of the sampled data with multiple process parameters to improve arcing detection and signal-to-noise ratio using a detection algorithm. For example, a discrete wavelet analysis may be used to decompose the sampled data into approximate and detail coefficients using a specific number of wavelet levels to efficiently isolate noise and facilitate arc event determination.

In many embodiments, additional features may be included. For example, event alarm notification may be provided and sent to manufacturing execution systems for manufacturing tool interdiction to reduce wafer scrap and yield loss during semiconductor manufacturing operations. As another example, corrective actions may be recommended or performed to avoid future arcing events while performing specific recipe components in a semiconductor manufacturing tool.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings.

DETAILED DESCRIPTION OF THE INVENTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Among other things, embodiments of the invention are directed to improving arc detection in semiconductor fabrication. An arc refers to electric breakdowns of a normally nonconductive media, such as air. An arc can produce luminous electrical discharges, such as sparks, which result from current flowing through the normally nonconductive media. Series arcs occur in series with the load current where, as an example, a current carrying line is broken. As such, series arc current can be no higher than the load current. Conversely, parallel arcs occur between oppositely charged conductors, such as a circuit and a grounded element, and may be characterized by high current spikes and little or no load impedance.

Arcing often occurs in semiconductor manufacturing processes. For example, DC bipolar arcs can occur in a physical vapor deposition (PVD) chamber due to a number of factors, for example: (1) semiconductor wafer misplacement causing contact with deposition on the deposition ring of the PVD tool, (2) excessive deposition on the deposition ring of the PVD tool, (3) deposition on the deposition ring peels of the PVD tool touching the semiconductor wafer, and (4) deposition on the deposition ring in contact with "bad" deposition on an electrostatic chuck (ESC) of the PVD tool. The arc magnitude formed on a semiconductor wafer can vary from a small arc around the edge of the wafer to a big arc that covers most of the wafer surface.

Currently, conventional arc detection systems are not adequate to capture all wafer arc events. In most cases, a typical DC bipolar arc occurs in about 5 to 600 milliseconds, and a typical data collection frequency is about 5 Hz leading to sporadic arcing event detection at best. In addition, an insufficient signal-to-noise ratio of the measured process parameters fails to capture typical anomalies amidst system process conditions resulting in missed arc events and significant false positive detections. These false positives may cause excessive equipment downtime to analyze the data and determine whether an arc event actually happened.

Figure 1:
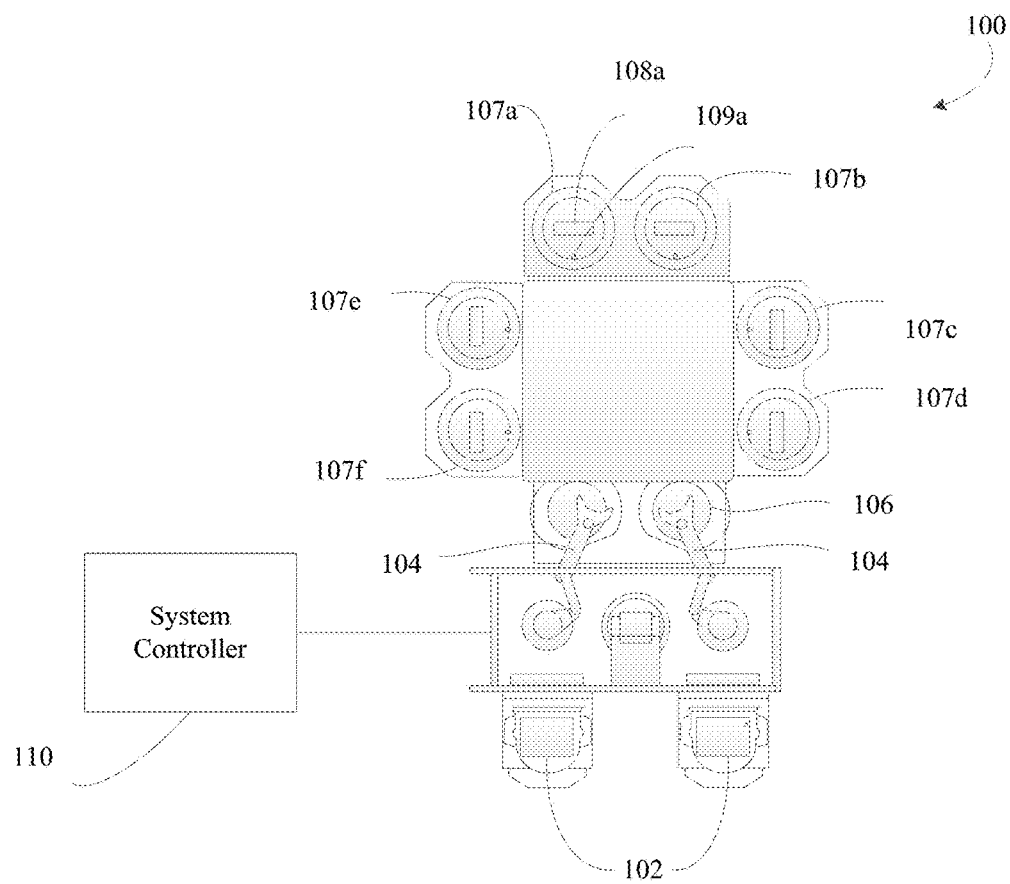
FIG. 1 illustrates an example arc detection system according to some embodiments of the invention.

FIG. 1 shows an example of a processing system 100 that may be used in embodiments of the invention. Processing system 100 may include a pair of FOUPs (front opening unified pods) 102 to supply substrates (e.g., 300 mm diameter wafers) that are received by robotic arms 104 and placed into a low pressure holding area before being placed into one of the wafer processing chambers 107a-f. Each processing chamber 107a-f can be outfitted to perform a number of substrate processing operations including the remote plasma processes described herein in addition to cyclical layer deposition (CLD), atomic layer deposition (ALD), chemical vapor deposition (CVD), PVD, etch, pre-clean, degas, orientation and other substrate processes.

The processing chambers 107a-f may include one or more system components for depositing, annealing, curing and/or etching on the substrate wafer. In one configuration, two pairs of the processing chamber (e.g., 107c-d and 107e-f) may be used to deposit dielectric material on the substrate, and the third pair of processing chambers (e.g., 107a-b) may be used to etch the deposited dielectric. In another configuration, all three pairs of chambers (e.g., 107a-f) may be configured to provide an etching process on the substrate. Any one or more of the processes described may be carried out on chamber(s) separated from the fabrication system shown in different embodiments.

Each processing chamber (e.g., 107a) may include a substrate support (e.g., 108a) configured to support a substrate within a processing chamber during a process. For example, substrate support 108a may be an electrostatic chuck (ESC) which holds and supports the substrate within the processing chamber 107a. In addition to a substrate support, each processing chamber (e.g., 107a) may also include at least one sensor (e.g., 109a) configured to measure one or more critical parameters associated with a substrate processing that takes place within the processing chamber (e.g., 107a) to generate an analog output signal representative of the measured parameters.

System controller 110 is used to control motors, valves, flow controllers, power supplies and other functions required to carry out process recipes by the processing system. System controller 110 may rely on feedback from optical sensors to determine and adjust the position of movable mechanical assemblies in processing chambers 107a-f. Mechanical assemblies may include the robot, throttle valves and susceptors which are moved by motors under the control of system controller 110.

In some embodiments, system controller 110 includes memory (e.g., a hard disk drive), input and output ports, and a processor. System controller 110 may include analog and digital input/output boards, interface boards, and stepper motor controller boards. Various parts of multi-chamber processing system are controlled by system controller 110. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

Figure 2:
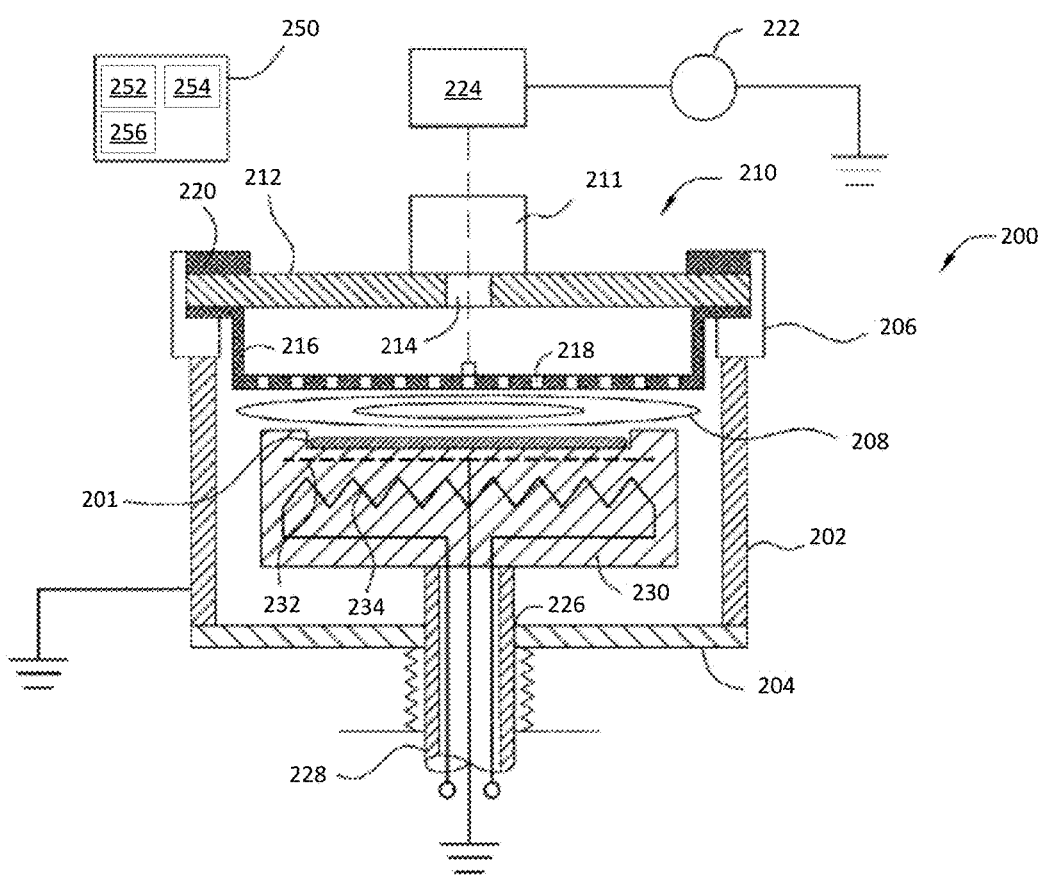
FIG. 2 illustrates another example arc detection system according to some embodiments of the invention.

Processing chamber (e.g., 107a) can be any type of processing chamber. One example is a PECVD chamber shown in FIG. 2. PECVD chamber 200 includes sidewalls 202, a bottom wall 204, and a chamber lid 206, which cumulatively define a processing region 208. A gas distribution system 210 is disposed through the chamber lid 206 to deliver gases into the processing region 208. The gas distribution system 210 includes a gas box 212 with a gas inlet 214 that receives processing gases from a precursor source 211 and that introduces processing gases into the gas box 212. The gas distribution system 210 also includes a showerhead 216 having a plurality of gas passages 218 for distributing the processing gases from the gas box 212 into the processing region 208. The gas distribution system 210 may also include a gas box heater 220, such as a ring-shaped, resistive heater, to heat processing gases to a desired temperature.

The showerhead 216 is coupled to an RF power supply 222 to provide electrical energy to the showerhead 216 to facilitate plasma formation in the processing region 208. Thus, the showerhead 216 acts as an upper, powered electrode. An auto-tuned RF matching network 224 is positioned between the RF power supply 222 and the showerhead 216. In one embodiment, the RF power is supplied at a frequency of about 23.56 M Hz.

The bottom wall 204 defines a passage 226 for a stem 228 that supports a pedestal heater 230. The pedestal heater 230 is configured to support a substrate 201 in the processing region 208. The pedestal heater 230 includes a ground mesh 232 embedded therein, which is connected to an RF ground. Thus, the ground mesh 232 acts as a ground electrode to facilitate plasma formation in the processing region 208 between the showerhead 216 and the pedestal heater 230. The pedestal heater 230 also includes one or more heating elements 234, such as resistive heating elements, to heat the substrate 201 to a desired processing temperature.

A control system 250, including a central processing unit (CPU) 252, a memory 254 and support circuits 256, is coupled to the various components of the chamber 200 to facilitate control of processing within the chamber 200. The memory 254 can be any computer-readable medium, such as random access memory (RAM), read only memory (ROM), floppy disk, hard disk, or any other form of digital storage, local or remote to the chamber 200 or CPU 252. The support circuits 256 are coupled to the CPU 252 for supporting the CPU 252 in a conventional manner. These circuits include cache, power supplies, clock circuits, input/output circuitry and subsystem, and the like. A software routine or a series of program instructions store in the memory 254, when executed by the CPU 252, causes the chamber 200 to perform plasma processes therein.

Deposition chambers that may benefit from the present invention include chambers configured to deposit oxides, such as carbon-doped silicon oxides, silicon containing films, and other dielectric materials including advanced patterned films (APF). An example of a deposition chamber is the PRODUCER™ chamber available from Applied Materials, Inc. of Santa Clara, Calif. The PRODUCER™ chamber is a PECVD chamber with two isolated processing regions that may be used to deposit carbon-doped silicon oxides and other materials. An example of a chamber is described in U.S. Pat. No. 5,855,681, which is incorporated herein by reference in its entirety. Although the chamber 200 is schematically depicted as a PECVD chamber, use of the invention may be equally affective on other chambers, such as plasma etch or PVD chambers.

Figure 3:
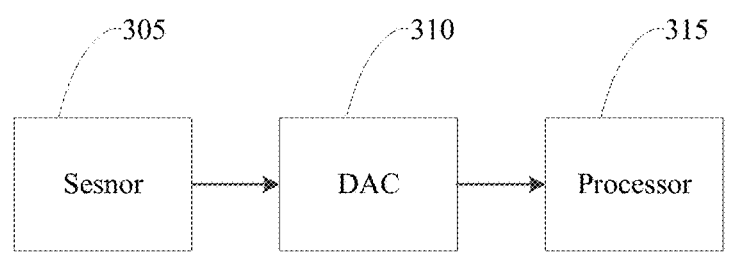
FIG. 3 illustrates an example data flow in an arc detection system according to some embodiments of the invention.

FIG. 3 shows a data flow according to some embodiments. Data is collected by a sensor at block 305. The sensor can return an analog output signal. A voltage can be sensed, for example, across a resistive element having current flow there-through. As another example, a bias voltage from a radio frequency (RF) powered electrode can be used as the output signal. As yet another example, a voltage or current can be sensed at any location within a chamber. Moreover, multiple process parameters can be sensed to determine arc events. For example, a spike in the current, and therefore voltage across the resistive element according to Ohms Law, can indicate an arc event. As another example, RF reflected power, electrostatic chuck current, probe voltage, etc. can be used. Moreover, more than one parameter can be collected and used to detect arcs.

DAC 310 can receive the analog output signal (e.g., a voltage signal) and samples the signal at a sampling rate. The high sampling rate, for example, can be above 20 kHz, 50 kHz, 100 kHz, 200 kHz, 300 kHz, 400 kHz, 500 kHz, 600 kHz, or 700 kHz. Collecting high sample rates of multiple process parameters allows for capturing almost every arc event including very short duration arcs that may not be detected using the conventional methods and systems. DAC 310 can digital convert the analog output signal from the sensor and output a digital signal. DAC 310 may be coupled with a fast buffer that stores the digital data.

DAC system 310 may be interfaced with processor 315. Processor 315 can analyze the digital output signal from DAC 310. This processing can include filtering the data, comparing the data with process/recipe data, determining whether an arc event occurred, and/or generating notification alarms or tool actions as specified by a user. Processor 315 may require collection of data using high rate collection, assimilating data in an acquisition system, processing the resulting signal, and then performing appropriate preventive action.

Figure 4:
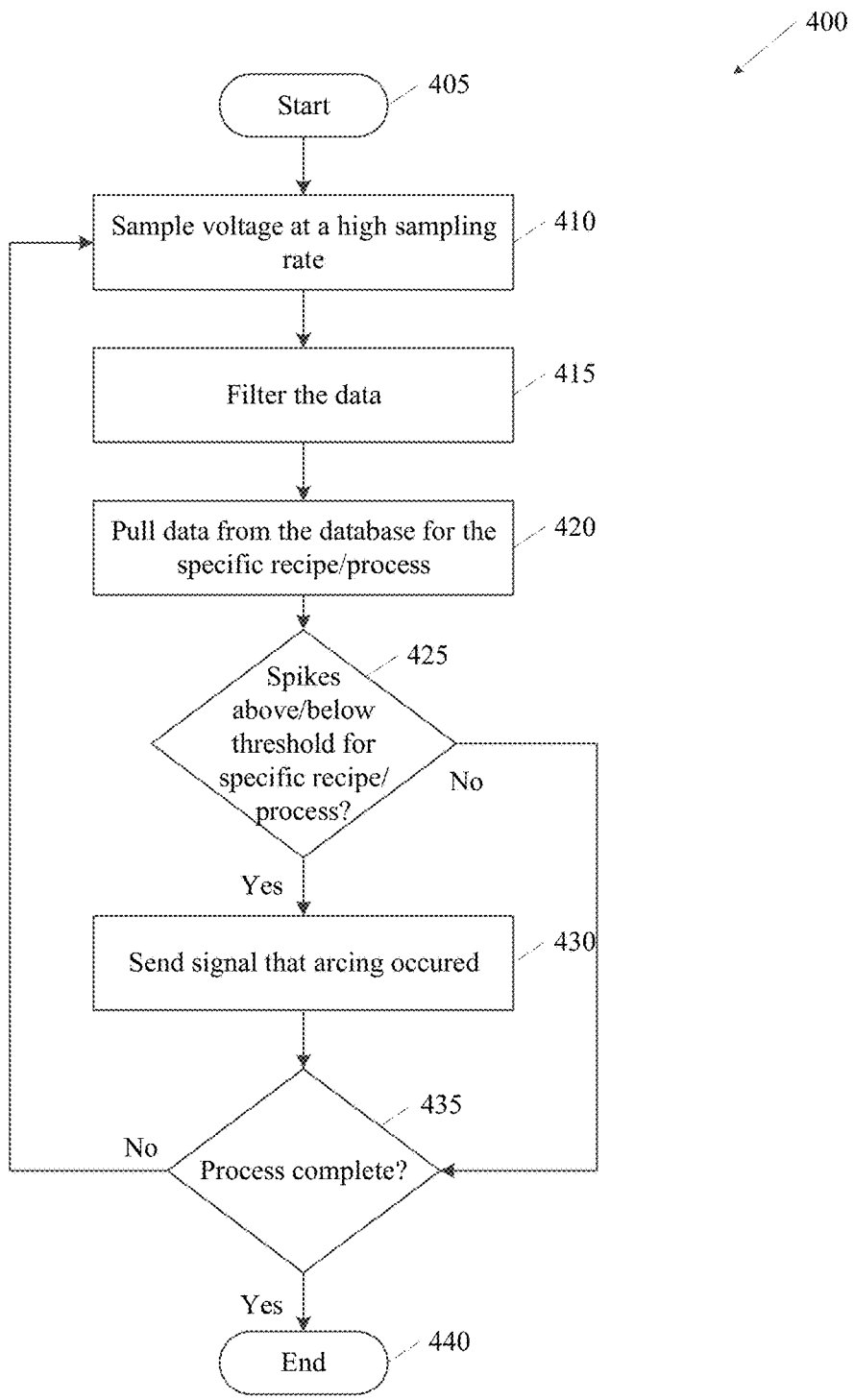
FIG. 4 is a flowchart of a process for detecting arc events according to some embodiments of the invention.

FIG. 4 shows a flowchart of process 400 for detecting arcs within a semiconductor processing chamber according to some embodiments of the invention. Process 400 starts at block 405. At block 410 voltage data is sampled at a high sampling rate. This voltage data can be associated with one or more processing parameters. The high sampling rate can be any sampling rate noted herein or higher. The sampled data can first be sensed with a sensor, for example, sensor 305 (e.g., voltage sensor), and/or converted to digital data, for example, with DAC 310.

Figure 5A:
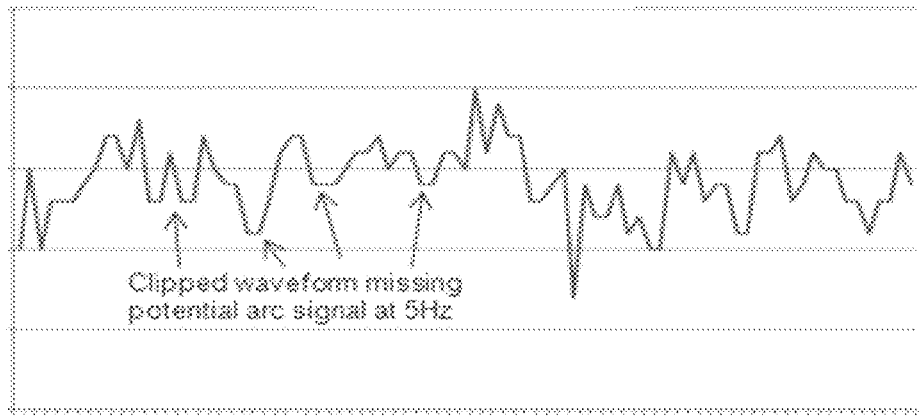
FIGS. 5A & 5B illustrate a comparison of data sampled at 5 Hz and 1000 Hz sample rates according to some embodiments of the invention.
Figure 5B:
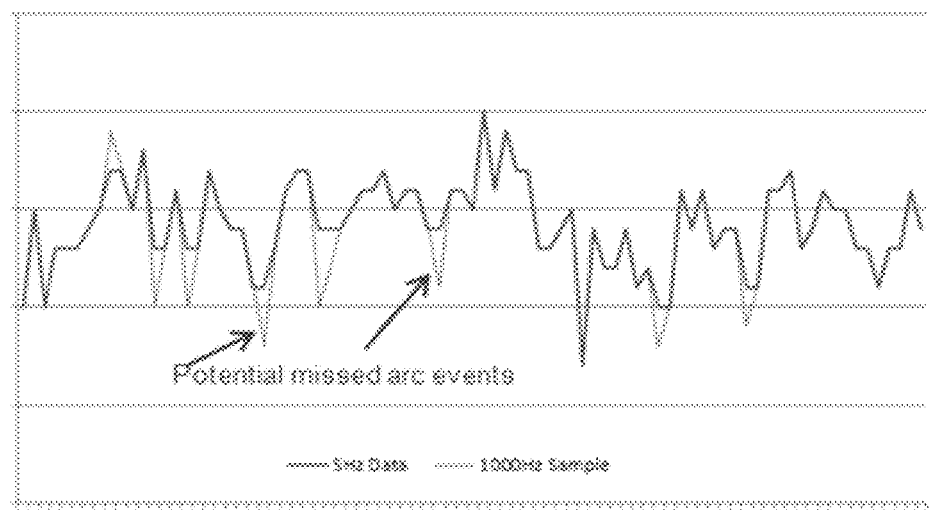

FIG. 5A shows a graph of data sampled from a process parameter using a low sampling rate, 5 Hz. As noted in the graph, the waveform is clipped at various points because of the low sampling rate. Because of this clipping, potential short duration arc events may not be detected. FIG. 5B shows the same data collected with a high sampling rate, 1000 Hz, overlay on the data shown in FIG. 5A. As shown by the high sampling rate line, quick data spikes can be found in many of the clipped data points in the low sampling rate line. By using a high sampling rate, more potential arc events such as short duration arc events may be detected.

Figure 6A:
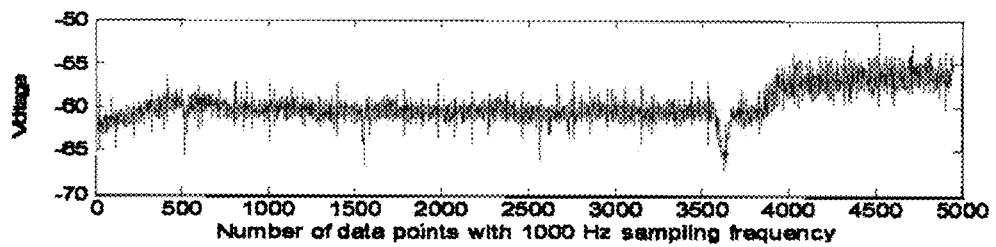
FIGS. 6A & 6B illustrate another comparison of data sampled at 5 Hz and 1000 Hz sample rates according to some embodiments of the invention.
Figure 6B:
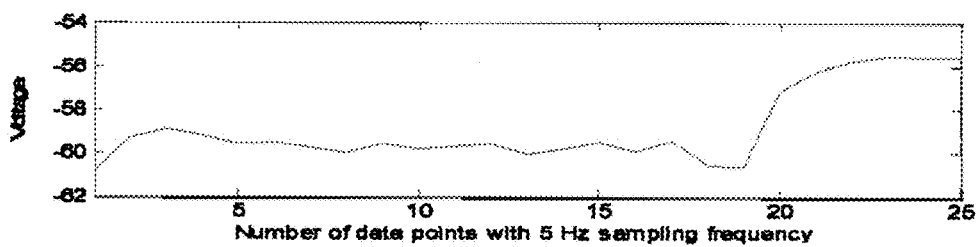

Embodiments of the invention can use a high sample rate to detect short duration arc events. In FIG. 6A, the original 1000 Hz sampled signal is shown; and in FIG. 6B the same signal decomposed to a 5 Hz sample rate is shown. It is well known from a sampling theory that a 5 Hz sample rate may not be adequate to reliably detect arc events less than about 400 milliseconds. As shown in FIG. 6B, all simulated arc events at a 5 Hz sample rate are not reliably detectable.

Returning to FIG. 4, at block 415, the sampled data is filtered to reduce the potential for false positives. While the use of a high sampling may provide more potential arc events, it may also provide more noise that may produce more false positive arc events. This conundrum can be solved by using various filtering techniques. In some embodiments, discrete wavelet transforms can be used to filter the data.

Discrete wavelet analysis may obtain low-pass approximations and band-pass details from the original signal. An approximation may contain the general trend of the original signal while detail embodies the high frequency content of the original signal. Through a wavelet scaling function, wavelet analysis can decompose a signal into different time windows and frequency bands, which are scaled and shifted versions of the mother wavelet.

In discrete wavelet analysis, a signal may be decomposed into approximate and detail coefficients by the convolution of the signal and the impulse responses of the low-pass and high-pass filters. At the first level of wavelet decomposition, the digital signal is decomposed to $A_1$ and $D_1$, and $A_1$ is decomposed to $A_2$ and $D_2$ respectively at the second level of decomposition. In general, the approximations ($A_{j+1}$) and details ($D_{j+1}$) at level j+1 can be expressed by convolutions equation (1) and equation (2) as shown below:

$$A_{j+1}[n] = \sum_{k=-\infty}^{\infty} h[2n-k]A_j[k], \text{ and}$$

$$D_{j+1}[n] = \sum_{k=-\infty}^{\infty} g[2n-k]A_j[k],$$

where h and g are the impulse responses of the low-pass and high-pass filters, respectively, which are discrete equivalents to the scaling function and wavelet.

Figure 7A:
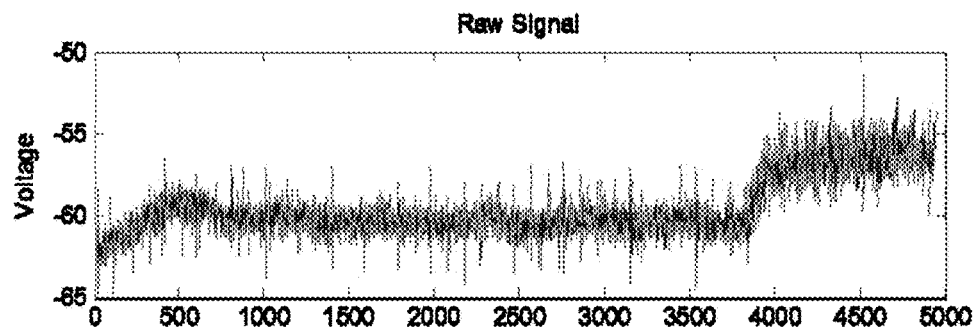
FIGS. 7A & 7B illustrate an example comparison of arc events added in the raw signal and arc events identified by wavelet analysis according to some embodiments of the invention.
Figure 7B:
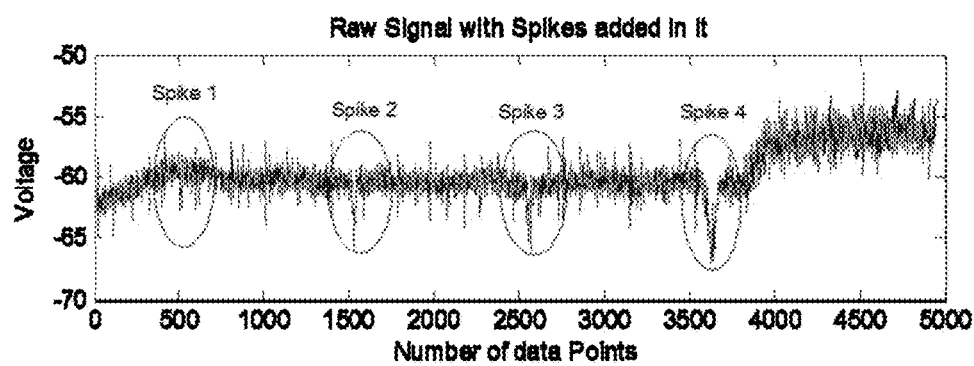

The wavelet analysis with a varying wavelet number of wavelet levels may be used to separate noise and improve the signal-to-noise ratio of the captured data. The signal-to-noise ratio may be improved by isolating arc signals embedded in the original signal (e.g., the voltage measured from a PVD tool). For example, FIG. 7A shows digital data recorded during a specific recipe component, and FIG. 7B shows the digital data with simulated arc events of varying duration and magnitude inserted within the data. As shown, there are four simulated arcs added in the 1000 Hz raw data as follows: (1) Arc 1: duration 40 ms and 2.5 volts magnitude, (2) Arc 2: duration of 20 ms and 5.5 volts magnitude, (3) Arc 3: duration of 15 ms and 3.75 volts magnitude, and (4) Arc 4: duration of 100 ms and 5.75 volts magnitude.

Returning to FIG. 4, at block 420, data is pulled from a database for the specific recipe and/or process in use within the chamber while the data is being collected. This data can include, for example, spike thresholds for the specific recipe or process for one or more process parameters. These spike thresholds can depend on the specifics of the deposition process. The threshold, for example, can be determined based on historical data training. This data can allow for arc detection by noting whether a data spike is above or below the threshold for the specific process or recipe as noted in block 425. As another example, the data can include any signal collected from portions of the tool, for example RF coil voltage, RF coil reflected power etc.

In some embodiments, the database can include a process ID that identifies the process occurring within the chamber and/or a process substep ID that identifies a subset (or recipe) that is part of the process. Moreover, the database can include a substrate ID that identifies the substrate being worked on within the chamber. In this way, the appropriate data can be retrieved from data for the specific substrate, process and/or process substep. The sampled data can be synchronized and/or compared with this data to determine whether an arc event occurred.

At block 430, if the spikes are above or below the specific threshold values, then a signal can be sent to a user, to a user interface, to a system controller (for example, system controller 110), or to a database indicating that an arc event has occurred. If, at block 425, no spikes are found above a threshold value, then process 400 goes to block 435, which determines if the process is complete. If the process is not complete, then process 400 returns to block 410; otherwise, process 400 moves to block 440.

Figure 8A:
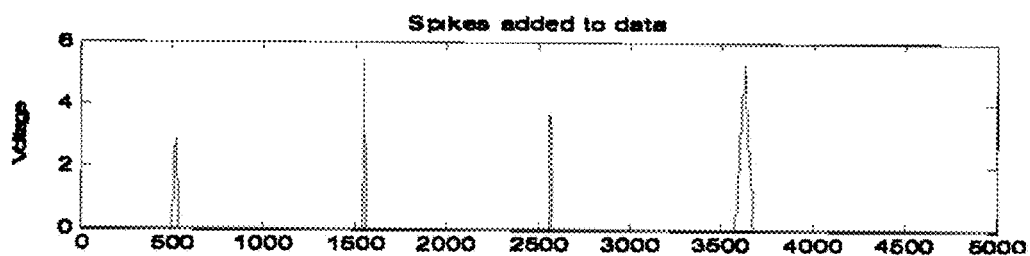
FIGS. 8A and 8B illustrate an example comparison of arc events added in the raw signal and arc events identified by wavelet analysis according to some embodiments of the invention.
Figure 8B:
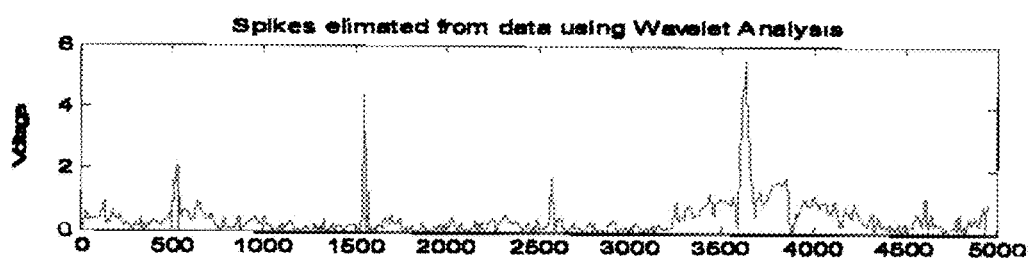

FIG. 8 shows a comparison of arc events added in the raw signal and arc events identified by the wavelet analysis. That is, FIG. 8A shows the raw arc events before adding them to the signal shown in FIG. 7A, and FIG. 8B shows these spikes reproduced after performing a wavelet analysis on the data shown in FIG. 7B. The wavelet analysis methodology can provide significantly improved signal-to-noise ratio, which can be helpful for a high capture rate of arc events with minimized to no false positives detections.

Figure 9:
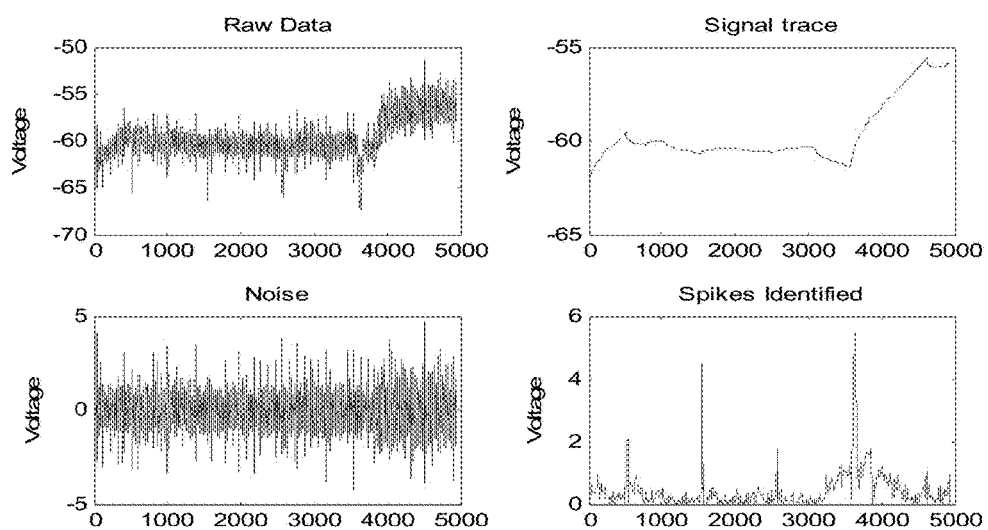
FIG. 9 illustrates an example wavelet analysis for a signal with arc events according to some embodiments of the invention.

As illustrated in FIG. 9, wavelet analysis may be applied to raw data with an added arc event of a semiconductor dataset to allow for separation of noise, arc signature, and original trace data.

The raw signal as a result of the high sample rate has amplified noise which can make it difficult to reliably detect arc events and not report a false positive. The noise from the signal can be separated using wavelet analysis, which can improve the signal to noise ratio in order to have a high capture rate of arc events while minimizing false positives. As can be seen, the bottom left graph of FIG. 9 shows the noise component, and the bottom right graph of FIG. 9 shows the arc signature of the wafer dataset after using a wavelet transform.

Due to overlapping frequencies in noise and arc signal of a wafer dataset, longer duration arc events may have a better resolution in arc magnitude, and shorter duration arc events may have degraded arc event magnitude at the 1000 Hz sampling frequency. It should be noted that 1000 Hz sample frequency may be capable of detecting arc events as short as 15 milliseconds. For detection of shorter duration arc events, the sample frequency may be increased accordingly. For example, the sample frequency can be increased up to approximately 250 kHz for proper arc event detection.

Figure 10:
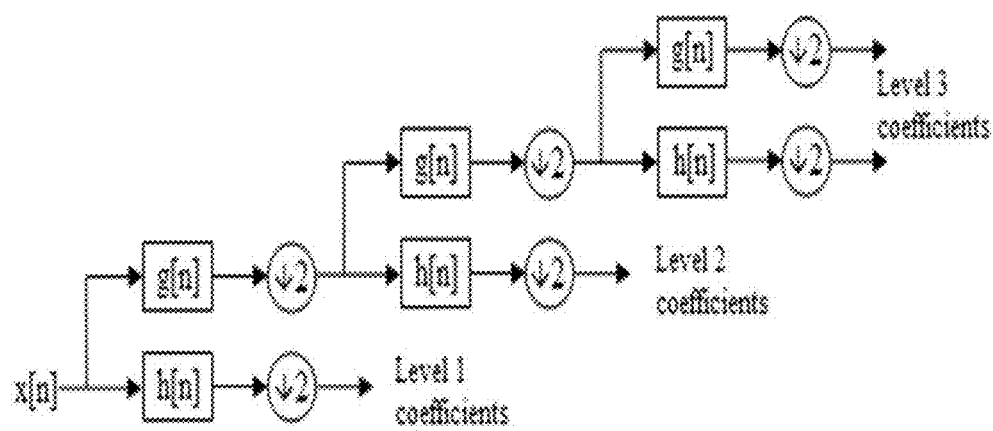
FIG. 10 illustrates an example of a level 3 wavelet decomposition according to some embodiments of the invention.

FIG. 10 illustrates an example of a level 3 wavelet decomposition according to some embodiments of the invention.

Figure 11:
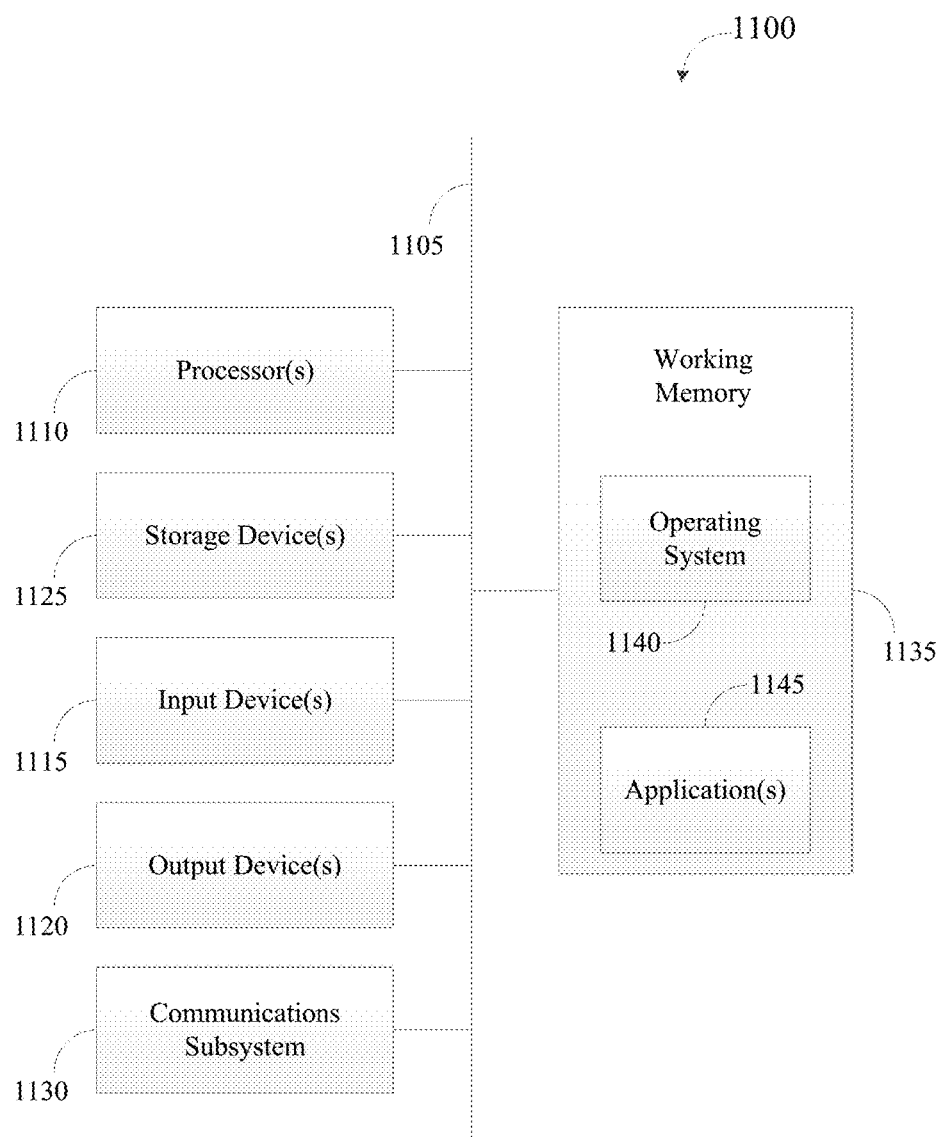
FIG. 11 shows an illustrative computational system for performing functionality to facilitate implementation of embodiments described herein.

The computational system 1100, shown in FIG. 11, can be used wholly, in part, or in conjunction with other components for various embodiments. For example, processor 315 can include all or portions of computation system 1100. Computational system 1100 is shown to include hardware elements that can be electrically coupled via a bus 1105 (or may otherwise be in communication, as appropriate). The hardware elements can include one or more processors 1110, including without limitation one or more general-purpose processors and/or one or more special-purpose processors (such as digital signal processing chips, graphics acceleration chips, and/or the like); one or more input devices 1115, which can include without limitation a mouse, a keyboard and/or the like; and one or more output devices 1120, which can include without limitation a display device, a printer and/or the like.

The computational system 1100 may further include (and/or be in communication with) one or more storage devices 1125, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system 1100 might also include a communications subsystem 1130, which can include without limitation a modem, a network card (wireless or wired), an infrared communication device, a wireless communication device and/or chipset (such as a Bluetooth device, an 802.11 device, a WiFi device, a WiMax device, cellular communication facilities, etc.), and/or the like. The communications subsystem 1130 may permit data to be exchanged with a network (such as the network described below, to name one example), and/or any other devices described herein. In many embodiments, the computational system 1100 will further include a working memory 1135, which can include a RAM or ROM device, as described above.

The computational system 1100 also can include software elements, shown as being currently located within the working memory 1135, including an operating system 1140 and/or other code, such as one or more application programs 1145, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 1125 described above.

In some cases, the storage medium might be incorporated within the computational system 1100 or in communication with the computational system 1100. In other embodiments, the storage medium might be separate from a computational system 1100 (e.g., a removable medium, such as a compact disc, etc.), and/or provided in an installation package, such that the storage medium can be used to program a general purpose computer with the instructions/code stored thereon. These instructions might take the form of executable code, which is executable by the computational system 1100 and/or might take the form of source and/or installable code, which, upon compilation and/or installation on the computational system 1100 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

In one aspect, the invention employs the computational system 1100 to perform methods of the invention. According to a set of embodiments, some or all of the procedures of such methods are performed by the computational system 1100 in response to processor 1110 executing one or more sequences of one or more instructions (which might be incorporated into the operating system 1140 and/or other code, such as an application program 1145) contained in the working memory 1135. Such instructions may be read into the working memory 1135 from another machine-readable medium, such as one or more of the storage device(s) 1125. For example, execution of the sequences of instructions contained in the working memory 1135 might cause the processor(s) 1110 to perform one or more procedures of the methods described herein.

The terms "machine-readable medium" and "computer readable medium", as used herein, refer to any medium that participates in providing data that causes a machine to operate in a specific fashion. In an embodiment implemented using the computational system 1100, various machine-readable media might be involved in providing instructions/code to processor(s) 1110 for execution and/or might be used to store and/or carry such instructions/code (e.g., as signals). In many implementations, a computer-readable medium is a physical and/or tangible storage medium. Such a medium may take many forms, including but not limited to, non-volatile media, volatile media, and transmission media. Non-volatile media includes, for example, optical or magnetic disks, such as the storage device(s) 1125. Volatile media includes, without limitation, dynamic memory, such as the working memory 1135. Transmission media includes coaxial cables, copper wire and fiber optics, including the wires that comprise the bus 1105, as well as the various components of the communication subsystem 1130 (and/or the media by which the communications subsystem 1130 provides communication with other devices).

Common forms of physical and/or tangible computer-readable media include, for example, a floppy disk, a flexible disk, hard disk, magnetic tape, or any other magnetic medium, a CD-ROM, any other optical medium, punch-cards, papertape, any other physical medium with patterns of holes, a RAM, a PROM, an EPROM, a FLASH-EPROM, any other memory chip or cartridge, a carrier wave as described hereinafter, or any other medium from which a computer can read instructions and/or code.

Various forms of machine-readable media may be involved in carrying one or more sequences of one or more instructions to the processor(s) 1110 for execution. For example, the instructions may initially be carried on a magnetic disk and/or optical disc of a remote computer. A remote computer might load the instructions into its dynamic memory and send the instructions as signals over a transmission medium to be received and/or executed by the computational system 1100. The communications subsystem 1130 (and/or components thereof) generally will receive the signals, and the bus 1105 then might carry the signals (and/or the data, instructions, etc., carried by the signals) to the working memory 1135, from which the processor(s) 1105 retrieves and executes the instructions. The instructions received by the working memory 1135 may optionally be stored on a storage device 1125 either before or after execution by the processor(s) 1110.

Figure 12:
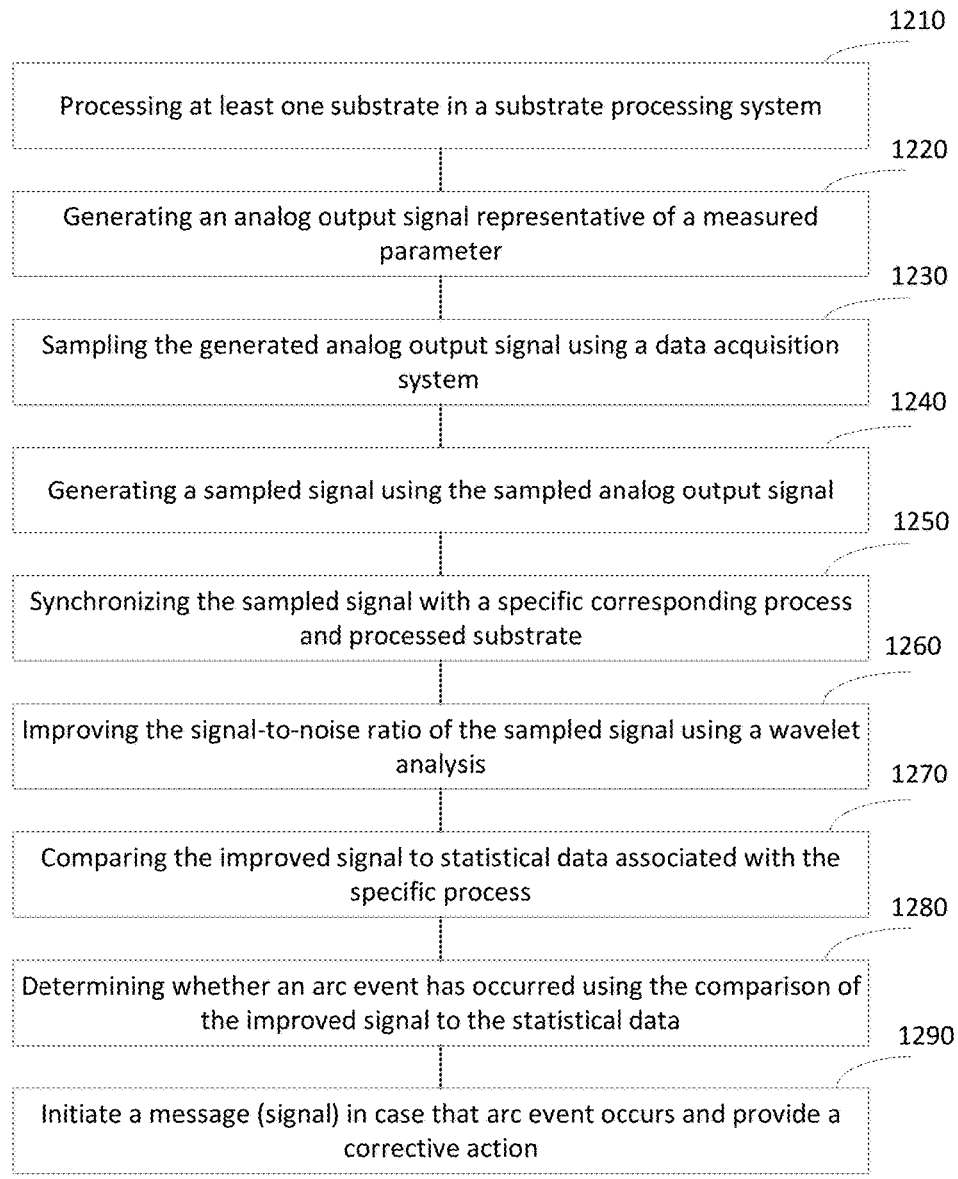
FIG. 12 shows yet another flowchart of a process for detecting arc events according to some embodiments of the invention.

FIG. 12 shows yet another flowchart of a process for detecting arc events according to some embodiments of the invention. At block 1210 at least one substrate is processed in a substrate processing system. At block 1220 an output signal is output corresponding to a measured parameter. At block 1230 the generated output can be sampled using a DAC. At block 1240 the sampled signal is generated using the sampled analog output signal.

At block 1250 the sampled signal is synchronized with a specific corresponding process and processed substrate. At block 1260 the signal-to-noise ratio of the sampled signal is improved. At block 1280, it is determined whether an arc event has occurred, using the comparison 1270 of the improved signal to the statistical data. If an arc event has occurred, then a signal is sent that is stored in the database and/or sent to a user interface at block 1290.

In embodiments, any of the entities described herein may be embodied by a computer that performs any or all of the functions and steps disclosed.

Any recitation of "a", "an" or "the" is intended to mean "one or more" unless specifically indicated to the contrary.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive.

What is claimed is:

1. An arc detection system comprising:
a substrate processing system for processing a plurality of substrates;
a data acquisition system operatively coupled to receive an analog output signal from the substrate processing system and sample the analog output signal at a sample rate of at least 500 Hz to generate a sampled signal; and
a fault detection system operatively coupled to receive the sampled signal from the data acquisition system and receive a substrate identification (ID) and process ID from the substrate processing system, the fault detection system configured to:
synchronize the sampled signal with the substrate ID and the process ID;
apply a wavelet analysis algorithm on the sampled signal to improve the signal-to-noise ratio; and
compare the results of the wavelet analysis algorithm to statistical data associated with the process ID to determine if an arc event occurred.

2. The arc detection system set forth in claim 1, wherein the substrate processing system comprises:
a substrate processing chamber;
a substrate support configured to support a substrate within the substrate processing chamber during a substrate processing operation;
a processor configured to run a process recipe to perform the substrate processing operation within the substrate processing chamber, the processor including a computer-readable memory configured to store the substrate ID that identifies the substrate being processed in the substrate processing chamber and the process ID that identifies the process recipe used to process the substrate in the substrate processing chamber; and
a sensor that measures a parameter associated with the substrate processing operation and generates the analog output signal representative of the parameter.

3. The arc detection system set forth in claim 2, wherein (i) when the process recipe includes multiple substeps, the computer-readable memory further stores a substep ID that identifies a process recipe substep, and (ii) the fault detection system is configured to synchronize the sampled signal with the substrate ID, the process ID, and the substep ID.

4. The arc detection system set forth in claim 2, wherein the substrate support is an electrostatic chuck and the sensor measures a bias voltage signal associated with the electrostatic chuck.

5. The arc detection system set forth in claim 1, wherein the fault detection system is further configured to, when the fault detection system determines that an arc event has occurred, generate a notification signal.

6. The arc detection system set forth in claim 5, wherein the notification signal is an email or a text message.

7. The arc detection system set forth in claim 5, wherein the notification signal includes the substrate ID.

8. The arc detection system set forth in claim 1, wherein the wavelet analysis algorithm uses discrete wavelet transforms to separate noise from a base voltage signal to isolate arc signals embedded in the sampled signal.

* * * * *